United States Patent
Saxena et al.

(10) Patent No.: US 6,810,482 B1
(45) Date of Patent: Oct. 26, 2004

(54) SYSTEM AND METHOD FOR ESTIMATING POWER CONSUMPTION OF A CIRCUIT THOURGH THE USE OF AN ENERGY MACRO TABLE

(75) Inventors: Vikram Saxena, Milpitas, CA (US); Renu Mehra, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 722 days.

(21) Appl. No.: 09/771,322

(22) Filed: Jan. 26, 2001

(51) Int. Cl.[7] .............................................. G06F 1/32
(52) U.S. Cl. ............................................... 713/320
(58) Field of Search .............................. 713/300, 320; 716/10; 714/733; 702/60; 345/439

(56) References Cited

U.S. PATENT DOCUMENTS

| | | | | |
|---|---|---|---|---|
| 5,754,435 A | * | 5/1998 | Sato .............................. | 702/60 |
| 5,940,779 A | * | 8/1999 | Gaitonde et al. .............. | 702/60 |
| 6,151,568 A | | 11/2000 | Allen et al. | |
| 6,463,560 B1 | * | 10/2002 | Bhawmik et al. ............ | 714/733 |
| 6,523,157 B1 | * | 2/2003 | Takahashi et al. ............ | 716/10 |

FOREIGN PATENT DOCUMENTS

JP    404131970 A   *   5/1992

OTHER PUBLICATIONS

Gupta, S. et al., 'Power Macromodeling for High Level Power Estimation' (1997).*
Bogliolo, A. et al., 'Parameterized RTL Power Models for Combinational Soft Macros' (1999).*
Chen R. et al., 'Architectural Level Hierarchical Power Estimation of Control Units' (1998).*
Jochens, G. et al., 'A New Parameterizable Power Macro-Model for Datapath Components' (1999).*

* cited by examiner

*Primary Examiner*—Thomas Lee
*Assistant Examiner*—Mark Connolly
(74) *Attorney, Agent, or Firm*—Bever, Hoffman & Harms, LLP; Jeanette S. Harms

(57) ABSTRACT

The present invention facilitates relatively accurate power consumption estimates performed at the register transfer level for scaleable circuits with similar architectural characteristics and features. A power evaluation process of the present invention includes a critical path delay based macro energy model creation process and a scaleable power consumption estimation process. In one embodiment of the present invention, the critical path delay based macro energy model creation process provides a base macro energy table and scaling functions (e.g., a bit width scaling function and a normalizing period scaling function). The scaleable power consumption estimation process utilizes the base macro energy table and scaling functions to estimate power consumption of a circuit. The base energy macro table comprises energy values that are based upon a critical path delay period and correspond to normalized toggle rates. Different bit width circuit toggle rates are converted to normalized toggle rates based upon time periods derived from a normalizing period scaling function. The normalized rates are utilized to lookup an energy per event value that is then scaled in accordance with a bit width scaling function of the present invention. The bit width scaling function is a polynomial function based upon a least square error analysis of sample bit width power consumption values corresponding to average characteristic parameters multiplied by a critical path normalization value (e.g., 1.2 times the critical path delay). The scaled energy per event value is divided by the critical path normalization value to provide an power consumption estimate for a particular bit width.

19 Claims, 5 Drawing Sheets

SYSTEM AND METHOD FOR ESTIMATING POWER CONSUMPTION OF A CIRCUIT THOURGH THE USE OF AN ENERGY MACRO TABLE

FIELD OF THE INVENTION

The present invention relates to the field of electronic integrated circuit design. More particularly, the present invention relates to a system and method for estimating power consumption and energy dissipation in an integrated circuit (IC) at the register transfer level (RTL), behavioral level and system level.

BACKGROUND OF THE INVENTION

Electronic systems and circuits have made a significant contribution towards the advancement of modem society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Electronic systems designed to provide these benefits include integrated circuits (ICs) that consume power. Power consumption typically has a significant impact on the operations of an IC and accurate modeling techniques are usually critical to design processes.

The complexity of commonly used integrated circuits has advanced dramatically and design efforts usually require the assistance of computer aided design (CAD) tools. The automated development of complex integrated circuits such as application specific integrated circuits (ASICs) is referred to as electronic design automation (EDA). EDA tools are usually software programs that provide instructions to a computer for processing information associated with a circuit design. Usually, input information for an EDA tool conforms to a description language such as Very High Speed Integrated Circuit (VHSIC) Hardware Description Language (VHDL), Verilog or C programming language and describes the functional attributes of a circuit. The description language files facilitate manipulation and design of IC components by an EDA tool across varying levels of abstraction from functional operation to physical structure. Designs are typically described in functional terms at a register transfer level (RTL), behavioral level or system level in VHDL, Verilog or C code which an EDA tool converts into a structural design of elements or circuits and from that point a gate level compilation is performed.

Designs typically evolve through different level of abstractions that provide different advantages in the design process. Most designs start with a system level description and that is converted into a RTL description in a description language like VHDL by EDA tools. The RTL description is converted into a gate level description by the CAE tools focusing on logic synthesis. The translation of RTL description into a gate level description is resource (e.g., labor) intensive process. Changes in the design usually require a re-write of the RTL description and reprocessing of the synthesis process.

A number of time consuming and resource intensive CAD techniques have been proposed for gate-level power estimation. EDA input manipulation is significantly easier at a functional design level but a design is not typically final when a functional description is written. Depending on the working attributes of the design, the size or bit widths of component selections by the synthesis process may vary and when synthesis is performed there may be a requirement to change the size of a component (e.g., a 6 bit adder, an 8 bit adder or a 32 bit adder, etc.). Although CAE design tools typically provide some assistance to engineers in designing and analyzing circuits, a sizable amount of valuable resources are expended interfacing with the CAE tools and after a design is specified at the gate level it is usually relatively expensive to make adjustments. One of the most significant challenges in modem circuit design is getting an accurate and reliable estimation of power consumption at an early point in the design process or at a convenient level of design abstraction such as the RTL, behavioral level and system level.

Designing complex electronic systems and circuits usually requires arduous analysis of numerous electrical characteristics, including power consumption and heat dissipation. Typically, it is important for a circuit design to provide for efficient energy use and power conservation. For example, portable electronic devices usually have limited power supplies and accurately estimating power consumption is particularly important. Estimating power consumption typically requires extensive calculations and manipulation of complicated electrical principles of physics. The analysis becomes even more complex when designers attempt to integrate numerous electronic components on a single integrated circuit chip, giving rise to a variety of factors requiring careful review and attention. For example, energy is usually dissipated as heat when the electronic system is performing certain functions and if IC components get overheated they usually stop operating properly and do not produce desired results. As the placement of transistors and other components in an IC becomes denser, heat dissipation concerns become compounded by the closeness of the components to one another. Despite design complications, densely placing components in an IC typically provides significant benefits such as increased functionality and reductions in size which enables greater portability.

Power is usually consumed by an complementary metal oxide semiconductor (CMOS) integrated circuit during operation cycles such as switching operations of a transistor. Typically, power is consumed and energy is dissipated as heat when the input and output logic values of combinational circuits toggle (e.g., when transistors of a logic gate engage in a switching activity). Some traditional power consumption modeling approaches attempt to capture the dependence of combinational IC power consumption on input and output activity (e.g., toggle events). One such approach involves power macromodels of three dimensional tables described in "Power Macromodeling for High Level Power Estimation" by Subodh Gupta and Farid Najm for DAC 97. It is often relatively expensive to create three dimensional table power macromodels for a particular circuit block and creating one for each possible circuit block that may be included in an IC usually requires expenditure of significant resources. Different target technologies usually have different power dissipation and require dedicated characterization runs.

ASIC chips typically include various functional components that are coupled together and to Input/Output (IO) cells. These functional components often have a similar architecture characteristics and features. For example, there are a number of functional components such as adders or multipliers that are made up of similar repetitive building block circuits. The functional components often have dimensional associations between inputs, for example some functional components have symmetrical inputs (e.g., a 4 by 4 adder, or an 8 by 8 adder, etc.). Functional components with similar architectures and input associations often have power consumption tendencies that are relatively scaleable and lend themselves to extrapolation based power consumption estimates. However, recent attempts at providing accurate abstract level (e.g., RTL) power consumption estimates for scaleable circuits are often relatively inaccurate and unreliable.

Some scaleable power consumption estimation approaches utilize constant multipliers such as those described in "Parameterzable RTL Power Models for Combinational Soft Macros" written by Bogliolo et al for ICCAD 99. Traditional constant multiplier approaches require power consumption characterization for a selected bit width and power consumption characteristics of other bit widths are calculated by multiplying the power characteristics of the selected bit width by a constant value. These prior constant multiplier approaches often lack sufficient accuracy since they do not account for a number of factors that affect power consumption. Circuits toggling at a rate faster than one toggle per critical path delay period display saturation effects which have a significant impact on power consumption. The critical path delay is different for different bit widths.

A change or toggle in a logical value of the input of a circuit block usually takes time to propagate through the components of an circuit block to the output and the critical path delay is the longest time a toggling event takes to propagate through the critical path from an input to the output of a circuit block (an example of, a toggling event is a change from a logical 1 to a logical 0). However, if the gap between consecutive toggles is less than the critical path delay of a circuit a later toggle event catches up to an earlier toggle event and toggle events start to cancel each other out before reaching the output of the circuit. For example, if a first toggle event is a change from a logical 0 to a logical 1 and a second toggle event is a change from a logical 1 to a logical 0 and the second toggle event catches up to the first, then from that point on the circuit will not switch from the logical 0 state. When toggle rates are high and toggle events are close enough together to cancel each other out there is relatively less energy dissipated because the first toggle event does not result in logic changes (switch transitions) all the way through a circuit. The average energy dissipated per input toggle is less when the average rate goes past the energy saturation point. FIG. 1 is an illustration of a input signal toggling at two different rates (toggle rate 120 and 140) that is fed into functional component 110. Toggle rate 120 is slower than one toggle per critical path delay period of functional component 110 and all toggle events appear on output 130. However, toggle rate 140 is faster than one toggle per the critical path delay period and some toggle events are lost in output signal 150.

The critical path delay of different bit width circuits usually vary. In general, the clock used to drive a circuit has a period greater than the critical delay. Traditional attempts at power estimation at a high level do not account for the varying clock period. "Power Macromodeling for High Level Power Estimation" by Subodh Gupta and Farid Najm for DAC 97 assumes a theoretical clock period of one and defines the toggle rate per period but does not define the period. The "Parameterzable RTL Power Models for Combinational Soft Macros" written by Bogliolo et al for ICCAD 99 indicates that the clock period for different bit widths changes but does not adequately account for these changes in the power estimation values.

What is required is a modeling system and method that facilitates relatively accurate power consumption modeling at a RTL, behavioral level or system level of automated IC design abstraction. The system and method should assist power consumption analysis that considers factors like impacts of critical path delay differences between symmetrical circuit blocks that vary in input dimension. The system and method should also assist more efficient use of power, reduction of heat dissipation density problems on the chip, production of reliable and longer lasting chips, and performance of power consumption analysis at the register transfer level (RTL).

SUMMARY

The present invention is a power consumption modeling system and method that facilitates relatively accurate power consumption modeling for estimating power at register transfer level (RTL), behavioral level and system level of IC design abstraction. The system and method assists power consumption analysis that considers impacts of critical path delay differences between symmetrical circuit blocks that vary in input dimension. The present invention also assists more efficient use of power, reduction of heat dispassion density problems on the chip and performance of power consumption analysis at the register transfer level (RTL), behavioral level and system level. This assists designers to meet desired power parameters without going through expensive RTL to gate iterations.

A power evaluation process of the present invention includes a critical path delay based macro energy model creation process and a scaleable power consumption estimation process. In one embodiment of the present invention, the critical path delay based macro energy model creation process provides a base macro energy table and scaling functions (e.g., a bit width scaling function and a normalizing period scaling function). The scaleable power consumption estimation process utilizes the base macro energy table and scaling functions to estimate power consumption of a circuit. The base energy macro table comprises energy values that are based upon normalized toggle rates which are determined by the critical path delay period. Toggle rates for different bit widths are converted to normalized toggle rates based upon time periods derived from a normalizing period scaling function. In one exemplary implementation of the present invention, the normalizing period scaling function is a polynomial function based upon a least square error analysis of critical path normalization values (e.g., 1.2 times the critical path delay) for sample bit widths (e.g., a relatively small selection of possible bit widths). The normalized toggle rates are utilized to lookup an energy per event value that is then scaled in accordance with a bit width scaling function of the present invention. The bit width scaling function is a polynomial function based upon a least square error analysis of sample bit width power consumption values corresponding to average characteristic parameters multiplied by a critical path normalization value (e.g., 1.2 times the critical path delay). The scaled energy per event value is divided by the critical path normalization value to provide an power consumption estimate for a particular bit width.

DETAILED DESCRIPTION

Reference will now be made in detail to the preferred embodiments of the invention, a power dissipation estimation system and method at the register transfer level, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The present invention facilitates relatively accurate power consumption estimates performed at the register transfer level for circuits with similar architectural characteristics and features. The power consumption evaluation system and method of the present invention provides efficient and effective scaleable estimates of power consumption with adjustments for toggle event cancellation that happens when the delay between toggle events is less than the critical path delay constraints. The critical path delay period is utilized to calculate energy values in a three dimensional base macro energy table and to normalize toggle rates. During "normal" operations substantial cancellation of toggle events is avoided when the toggle events (e.g., transitions in logic values) at the input of a combinational circuit occur at a toggle rate equal to or less than one toggle per every critical path delay period of a circuit. The toggle rate is normalized by placing an upper bounding limit of one toggle event per unitary period in which the unitary period is related to the critical path delay. The normalized toggle rate is utilized to look up a energy per event value in the base macro energy table. The energy per event value looked up is scaled to the desired bit width and the scaled result is divided by the normalization period to provide a power consumption estimate. In one exemplary implementation of the present invention, a computer system is utilized to automatically perform the power consumption evaluation process of the present invention.

Figure 1:
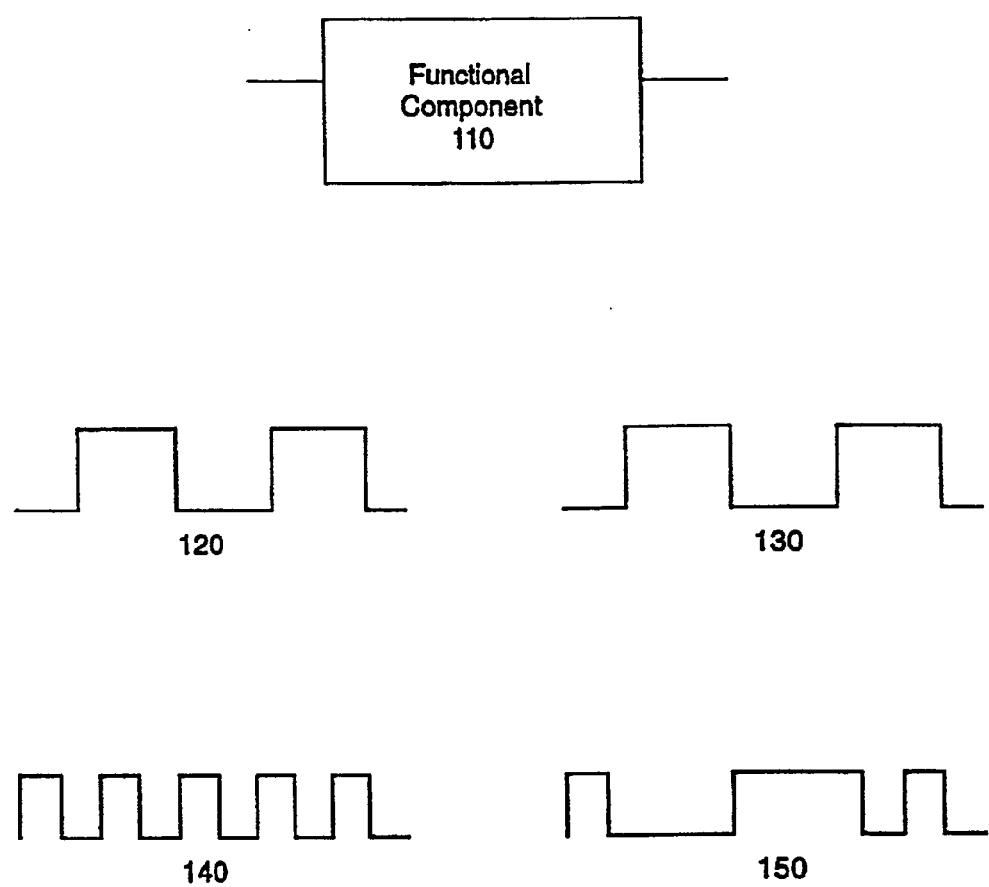
FIG. 1 is an illustration of a input signal toggling at two different rates that is fed into a functional component, one toggle rate is faster than the critical delay path and one toggle rate is slower than the critical path delay.
Figure 2:
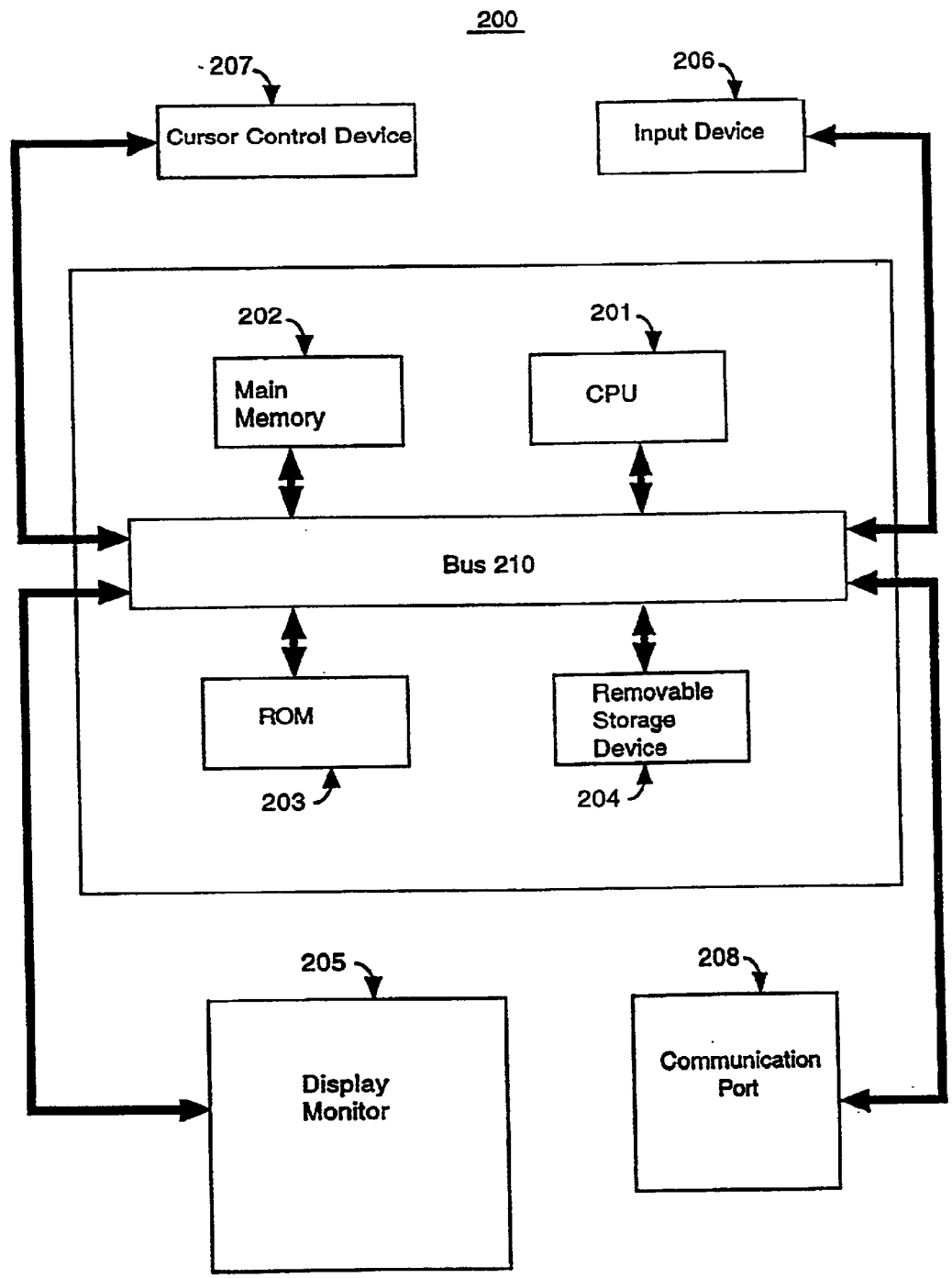
FIG. 2 is a block diagram of computer system 200, one embodiment of the present invention.

FIG. 2 is a block diagram of computer system 200, one embodiment of the present invention. Computer system 200 includes address/data bus 210, central processor 201, volatile memory 202 (e.g., random access memory RAM), non-volatile memory 203 (e.g., read only memory ROM), optional removable data storage device 204, display device 205, alphanumeric input device 206, cursor control or directing device 207, and signal communication port 208. Address/data bus 210 is coupled to central processor 201, volatile memory 202 (e.g., random access memory RAM), non-volatile memory 203 (e.g., read only memory ROM), display device 205, alphanumeric input device 206, cursor control or directing device 207, and signal communication port 208. The components of computer system 200 cooperatively function to provide a variety of functions. Address/data bus 210 communicates information, central processor 201 processes information and instructions, volatile memory 202 (e.g., random access memory RAM) stores information and instructions for the central processor 201 and non-volatile memory 203 (e.g., read only memory ROM) stores static information and instructions. Display device 205 displays information to the computer user and alphanumeric input device 206 and directing device 207 are input device. Communication port 208 is a communication interface for communicating signals to and from a coupled peripheral device (not shown).

Computer system 200 also comprises computer aided design (CAD) tools and performs power evaluation processes of the present invention. Memory components of computer system 200 store present invention power evaluation process information and instructions that are implemented by processor 201. In one exemplary implementation of the present invention, memory 202 stores directions and information associated with critical path delay based macro energy model creation process. Processor 201 performs the critical path delay based macro energy model creation process instructions and computer system 200 stores the results (e.g., a base macro energy table, a bit width scaling function and a normalizing period scaling function stored in memory 202). Computer systems then utilizes these results to estimate power consumption of different bit width circuits based upon a present invention scaleable power consumption estimation process instructions.

Figure 3:
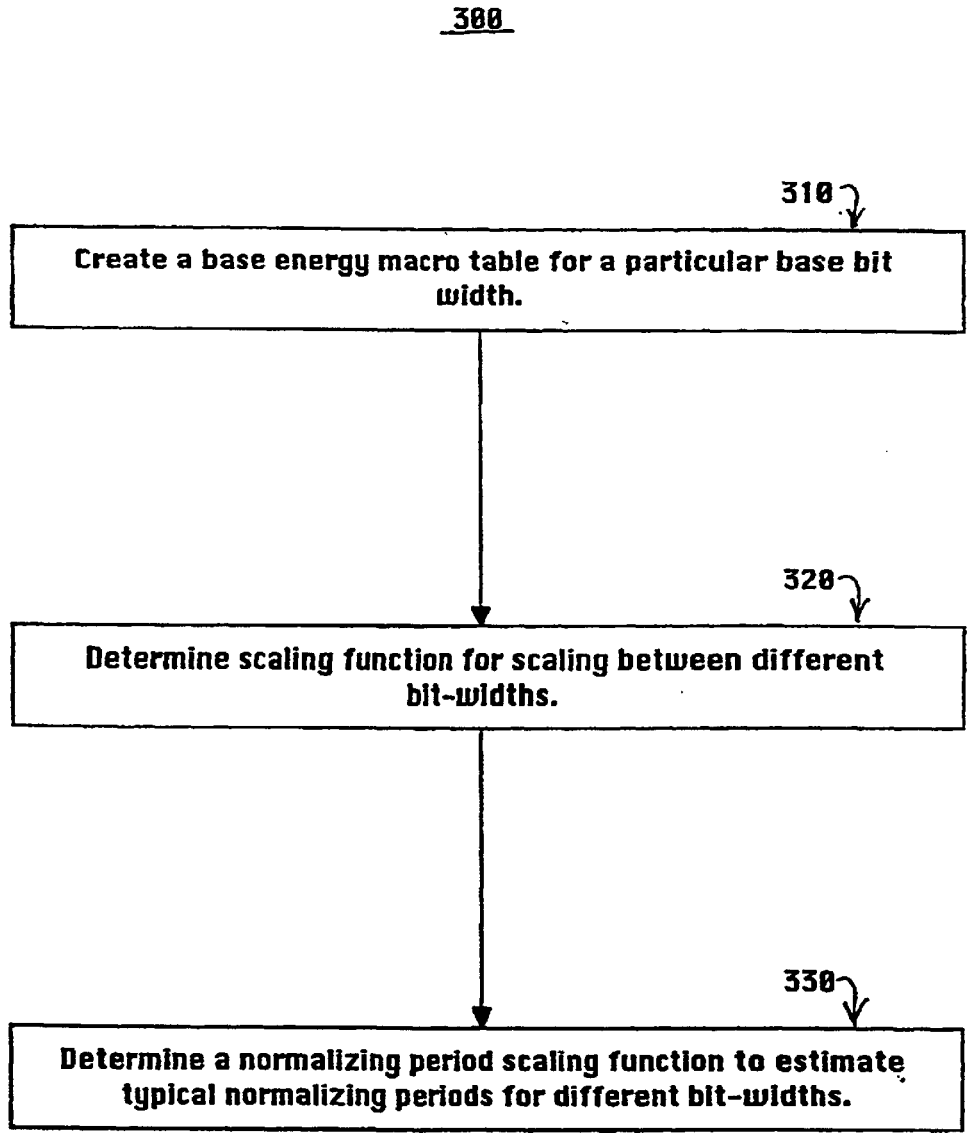
FIG. 3 is a flow chart of one embodiment of a present invention power modeling method.

FIG. 3 is a flow chart of critical path delay based macro energy model creation method 300. Critical path delay based macro energy model creation method 300 is utilized to characterize a parameterized circuit block such as an adder circuit or multiplier circuit. In one embodiment of the present invention, critical path delay based macro energy model creation method 300 is utilized to estimate power consumption and heat dissipation in symmetrical circuits. For example, critical path delay based macro energy model creation method 300 is utilized in one implementation of the present invention to estimate the power consumption of a 2 by 2 bit width adder circuit, a 4 by 4 bit width adder circuit, a 6 by 6 bit width adder circuit, etc.

In step 310 a base energy macro table is created for a particular base bit width circuit block. In one embodiment of the present invention, the base energy macro table comprises a three dimensional table and is utilized for a high-level (e.g., RTL) power estimation. In one exemplary implementation, the three dimensions or axes of the energy per event table comprise normalized average toggle rates for the inputs (TRin) to the circuit block, average static probabilities for the inputs (SPin) of the circuit block, and normalized average toggle rates for the outputs (TRout) from the circuit block. The TRin rate and TRout rate are normalized to provide an upper boundary with a theoretical unitary value of one. Thus, the average toggle rate input is between zero and one (0<TRin<1), the average static probability is between zero and one (0<Spin<1), and the average toggle rate output is between zero and one (0<TRout<1). There is no more than one toggle event per normalization period (e.g., 1.2 times the critical path delay).

The terms of the base energy macro table are characterized by directing vector streams at varying rates less than one toggle per critical path delay, simulating a circuit and counting the number of times the circuit toggle event propagates through the circuit, calculating the power, and multiplying the power consumption by the normalization period to calculate the energy. Thus, there are a range of points at which the circuit is characterized and they bounded by 0 to 1 where 1 is a unitary value corresponding to an approximation of the critical path delay. In one exemplary implementation of the present invention, the range includes a TRin scale of {0.001, 0.005, 0.01, 0.05, 0.1, 0.3, 0.5, 0.75, 0.9}, a TRout scale of {0.05, 0.2, 0.4, 0.6, 0.8, 0.95}, and a SPin scale of {0.1, 0.3, 0.5, 0.7, 0.9}. The table is characterized using a number of zero delay simulation runs. In one embodiment of the present invention, full timing simulations are used to achieve greater accuracy even though the full timing simulations are more run time expensive than zero delay simulation runs. Each power number is multiplied by the normalization period used to define a TR=1.0 and energy per event is stored in the table. In one exemplary implementation of the present invention this normalization period is selected to be equal to 1.2 times the critical path delay for the module.

In one exemplary implementation of the present invention the critical path delay is 10 ns and the normalized base energy macro table model upper boundary toggle rate is one toggle every 12 ns. The power consumption is characterized by creating and generating a random stream of bits such that the toggle rates are between a normalized value of 0 and 1. Thus, if the average toggle rate is at 0.1 it toggles once in every ten clock cycles or once in every 120 nanoseconds. In one embodiment of the present invention, a normalization period greater than the critical path delay is utilized because the operating frequency of the circuits is slightly less than the limit imposed by the critical path delay. In one exemplary implementation of the present invention a normalization value of 1.2 times the critical path delay is utilized.

In step 320, bit width scaling functions are determined for scaling energy per event values established for the particular bit width in step 310 to other bit widths. In one embodiment of the present invention a polynomial function is created to scale the "energy per event" between different bit widths. A sample power consumption value corresponding to average characteristic parameters (e.g., TRin equal to 0.5 and SRin equal to 0.5) is generated for a sample number (e.g., relatively small selection) of possible bit widths. The power consumption values corresponding to the average characteristic parameter is multiplied by a normalization period (e.g., 1.2 times the critical path delay). In one exemplary implementation of the present invention the bit width scaling functions are obtained using the least square error method to the different bit width sample results for the same average characteristic parameters. In one embodiment of the present invention two polynomial bit width scaling functions are created, one for bit widths less than the base bit width selected for constructing the base energy macro table and another polynomial bit width scaling function for bit widths greater than the selected base bit width.

In one embodiment of the present invention the bit width scaling function is conditioned to achieve greater accuracy. There are a number of factors that impact the conditioning of a bit width scaling function. In one exemplary implementation of the present invention a bit width scaling function is not well behaved at the end points. For example, a linear bit width scaling function of the form $f(x)=ax+b$ may have a negative constant (b) resulting in negative f(x) values for small values of x. In one exemplary implementation of this case it is appropriate to use a scaling function which does not have a constant term but has a negative second order term such as $f(x)=ax^2+bx$ with a<0 and b>0 for $|a|<<|b|$. Scaling functions with negative coefficient values for the higher order terms may not be well behaved at higher values of x. Thus, in one exemplary implementation of the present invention comprises a lower order function which includes a constant for value of x greater than the value used to generate the table. In one embodiment of the present invention, the bit width scaling function is tested and validated at appropriate sample points throughout the entire range of bit widths for which it is valid.

In step 330 a normalizing period scaling function to estimate the typical normalizing period for different bit widths is determined. In one embodiment of the present invention, a polynomial to express the normalization period of a particular bit width is constructed for an implementation of the module in a particular technology and at a particular optimization point. The normalization period is calculated for each of the different bit widths in the sample number utilized to obtain data points for extrapolating the bit width scaling function. In one exemplary implementation, the normalization period is 1.2 times the critical path delay. In one embodiment of the present invention, a least square error based curve fitting is utilized to derive the scaling function and the scaling function is confirmed to be well behaved at the end points.

Figure 4:
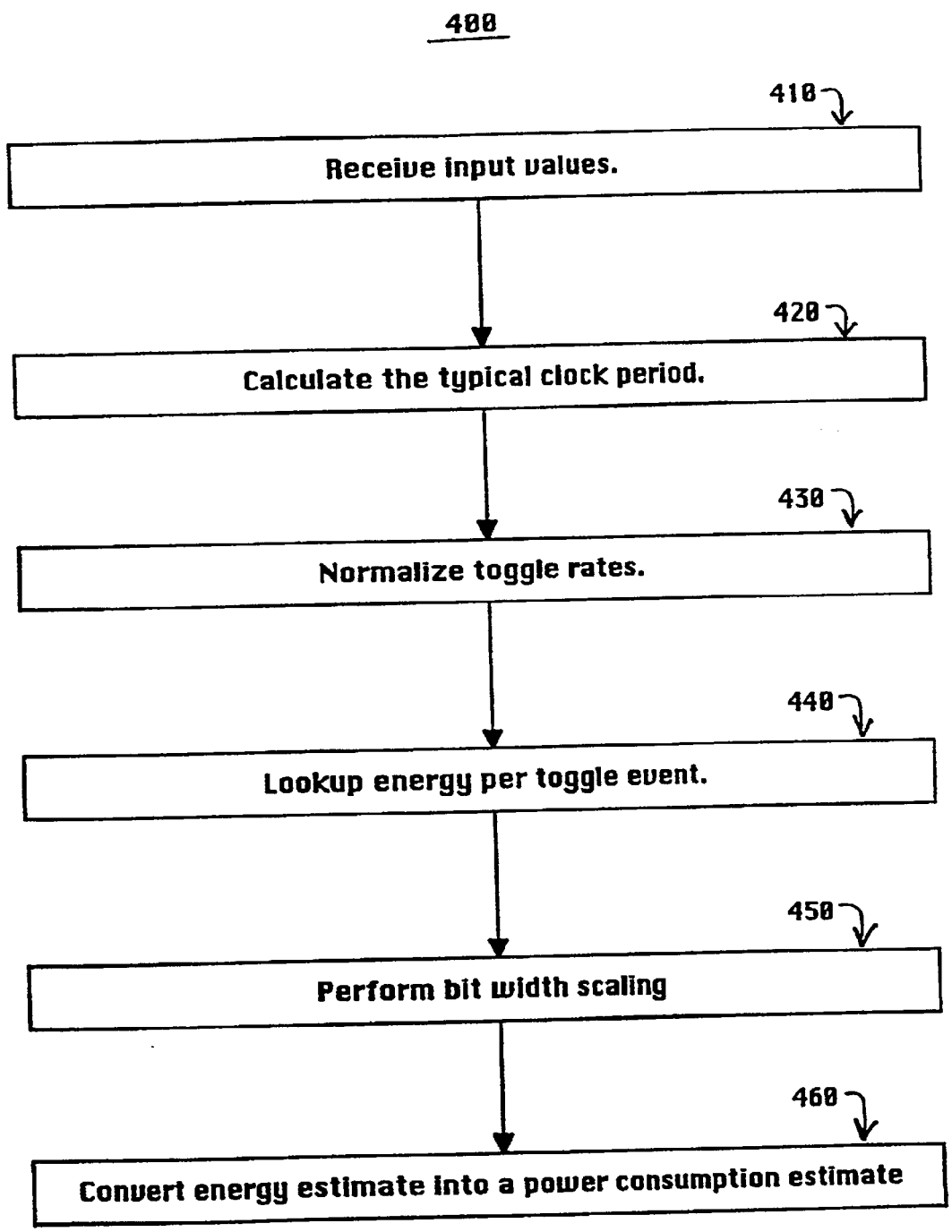
FIG. 4 is a flow chart of power estimation process, one embodiment of estimating the power consumption for a particular bit width circuit in accordance with the present invention.

FIG. 4 is a flow chart of power consumption estimation process 400, one embodiment of estimating the power consumption for a required bit width circuit. Power consumption estimation process 400 includes looking up an energy dissipation value in a power macromodel table for a particular bit width and scaling the energy dissipation value to estimate energy dissipations for similarly symmetrical circuit blocks of different bit widths. Power consumption estimation process 400 utilizes a bit width scaling function and a normalizing period scaling function based upon the critical path time delay of the circuit block.

In step 410 the base energy macro table input values are established. In one embodiment of the present invention the base energy macro table input parameters include bit width, absolute TRin, absolute TRout, and SPin.

In step 420 the normalizing period is calculated using a normalizing period scaling function. In one exemplary implementation of the present invention, the normalizing period scaling function determined in step 330 of critical path delay based macro energy model creation method 300 is utilized.

In step 430 the toggle rates are normalized. In one embodiment of the present invention TRin and TRout are normalized at the module input/outputs based on the normalizing period calculated in step 420. In one exemplary implementation of the present invention, a toggle rate per second is converted into a fraction of toggle events per normalizing period.

In step 440 the energy per toggle event is looked up in the energy per toggle table using the normalized TRin, normalized TRout and SPin values.

In step 450 the looked up energy per toggle event is scaled to the value for the desired bit width estimation in accordance with a bit width scaling function of the present invention. In one exemplary implementation of the present invention, the bit width scaling function determined in step 320 of critical path delay based macro energy model creation method 300 is utilized.

In step 460 the scaled energy per toggle event is converted into a power consumption estimate by dividing the scaled energy per toggle event by the normalization period calculated in step 420.

Figure 5:
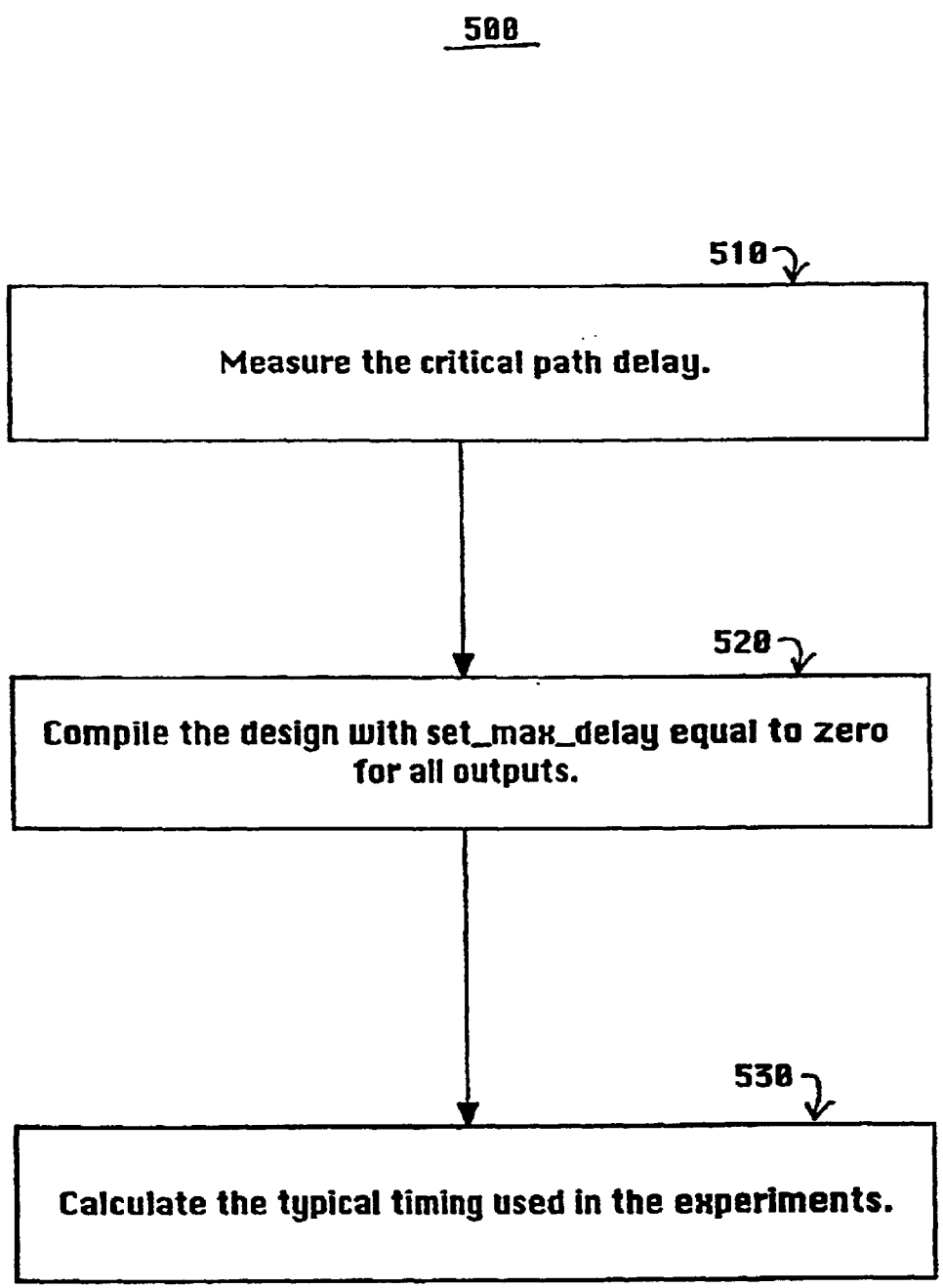
FIG. 5 is a flow chart of area-timing trade-off point procedure of one embodiment of the present invention.

In one embodiment of the present invention, the implementation for each bit-width is compiled at similar area-timing trade-off points for the purpose of developing the above models. FIG. 5 is a flow chart of area-timing trade-off point procedure 500, one embodiment of the present invention.

In step 510 the critical path time delay (Ta) is measured. In one embodiment of the present invention the critical path time delay (Ta) is measured at a slowest operation point. In one exemplary implementation the design is compiled with set_max_area equal to zero, results in the smallest design.

In step 520 the design is compiled with set_max_delay equal to zero for all outputs. This results in the fastest possible design for that particular architecture and technology. The critical path Tf is measured.

In step 530 the typical timing (Tt) used in the experiments is calculated. In one embodiment of the present invention, the typical timing (Tt) used in the experiments is equal to Tf+⅓(Ta-Tf). The power dissipated is strongly dependent on the timing constraints and the present invention includes a maximum or minimum power table for some applications.

The normalizing period scaling function provides corrective conditioning to the power estimation to bring it closer to actual power consumption by a circuit. The power dissipated in a block does not typically increases linearly as the TRin increases. This is because of saturation effects, where input toggles cancel out and do not propagate deep into the circuits. This effect is captured by the 3D table. When using one table for different bit-widths, scaling the clock period used to normalize the toggle rates improves the accuracy. The table is looked up at the same normalized TRin point that would have been used if a dedicated table for that bit width is constructed.

In some implementations of the present invention the error introduced by the scaling functions is independent of the TRin values when power saturation is similar with different bit widths for all TRin values. In another exemplary implementation of the present invention, different scaling functions are utilized for circuit blocks in which similarity in power saturation curves varies appreciably between different TRin values. For example, the TR region is divided into 3 components or regions such as TRin less than 0.3 (TRin<0.3), TRin between 0.3 and 0.7 (0.3 <TRin <0.7 and TRin greater than 0.7 (TRin >0.7).

One embodiment of the present invention includes adjustments for asymmetrical bit with inputs. In one exemplary implementation of the present invention scaling functions with multiple variable for different bit width values are utilized. In another exemplary implementation, multiple base energy macro tables are utilized and specially tailored for different bit width ratios.

One embodiment of the present invention includes steps directed to addressing glitching effects. This is particularly important for deep combinational circuits in which glitching power is more prevalent (e.g., multipliers). In one exemplary implementation of the present invention, characterization is performed using a full timing model and information regarding corresponding zero-delay toggle rates is maintained. The final base energy macro table is constructed using the zero-delay toggle rates for indexing into the table (cycle based), but the energy (power) data is from a full-timing simulation. In another exemplary implementation, a characterization is performed with zero delay simulation and the values are scaled by some calibrating full timing simulations. In yet another embodiment of the present invention, glitches due to chaining effects are accommodated by attaching a glitch factor to the toggle rate resulting in an indication of the ratio between the zero delay toggle rates and the full timing toggle rates for a signal.

Thus, the present invention is a modeling system and method that facilitates relatively accurate power consumption modeling at a RTL, behavioral level or system level of automated IC design abstraction. The system and method assists power consumption analysis that considers impacts of critical path delay differences between symmetrical circuit blocks that vary in input dimension. The present invention also assists more efficient use of power, reduction of heat dispassion density problems on the chip and performance of power consumption analysis at the register transfer level (RTL), behavioral level and system level.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A critical path delay based macro energy model creation method comprising the steps of:

establishing an energy macro table for a particular bit width, said energy macro table including energy per event values based on a critical path delay period;

determining bit width scaling functions for scaling energy per event values for different bit-widths;

determining a normalizing period scaling function to estimate the normalizing period for the different bit widths; and estimating the power consumption for a particular circuit.

2. The critical path delay based macro energy model creation method of claim 1 in which said energy macro table comprises a three dimensional table.

3. The critical path delay based macro energy model creation method of claim 2 in which said dimensions include a normalized average toggle rate for the inputs (TRin) to a circuit block, an average static probability for the inputs (SPin) of the circuit block, and a normalized average toggle rate for the outputs (TRout) from the circuit block.

4. The critical path delay based macro energy model creation method of claim 1 wherein said bit width scaling function is a polynomial function created to scale the energy per event between different bit widths.

5. The critical path delay based macro energy model creation method of claim 1 further comprises the step of generating energy per event values corresponding to average characteristic parameters for a sample number of varying bit width circuits.

6. The critical path delay based macro energy model creation method of claim 1 wherein a power value is utilized to establish said energy per event table.

7. The critical path delay based macro energy model creation method of claim 6 wherein the power number is multiplied by the normalization period for each bit width.

8. The critical path delay based macro energy model creation method of claim 7 wherein said normalization period is 1.2 times the critical path delay of the circuit block.

9. The critical path delay based macro energy model creation method of claim 8 further comprising the step of creating two polynomial scaling functions, one for bit widths less than the bit-width selected for constructing the energy table, and the other for bit widths greater than the selected bit widths.

10. The critical path delay based macro energy model creation method of claim 9 wherein said scaling function is obtained using the least square error method.

11. The critical path delay based macro energy model creation method of claim 9 further comprising the step of conditioning the scaling function.

12. The critical path delay based macro energy model creation method of claim 9 further comprising the step of utilizing a scaling function which has a negative second order term.

13. The critical path delay based macro energy model creation method of claim 9 wherein said scaling function to estimate the normalization period for different bit widths is a polynomial constructed for an implementation of the module in a particular technology at a particular optimization point.

14. The critical path delay based macro energy model creation method of claim 9 wherein the normalization period is a multiple of the critical path delay.

15. The critical path delay based macro energy model creation method of claim 14 wherein the multiple is 1.2.

16. The critical path delay based macro energy model creation method of claim 1 wherein the power value is scaled for different bit width translations according to the bit width scaling function and the typical normalization period scaling function.

17. A power consumption estimation method comprising the steps of;
   establishing input values;
   calculating the typical clock period;
   normalizing toggle rates;
   looking up energy per toggle event;
   performing bit width scaling; and
   converting an energy estimate into a power dissipation estimate, wherein calculating the typical clock period and performing bit width scaling are based on a critical path time delay.

18. A power consumption estimation method of claim 17 wherein the energy per event table parameters include bit width, an absolute toggle rate for the inputs (TRin) for a circuit block, an absolute toggle rate for the outputs (TRout), and an average static probability for the inputs (SPin) of a circuit block.

19. A power consumption estimation method of claim 18 wherein the TRin and TRout are normalized at the module input/outputs based on the calculated clock-period.

* * * * *